(12) United States Patent
Knuepfer

(10) Patent No.: US 9,190,364 B2
(45) Date of Patent: Nov. 17, 2015

(54) DIE AND CHIP

(71) Applicant: Infineon Technologies Austria AG, Villach (AT)

(72) Inventor: Bernhard Knuepfer, Otterfing (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/054,931

(22) Filed: Oct. 16, 2013

(65) Prior Publication Data

US 2015/0102493 A1     Apr. 16, 2015

(51) Int. Cl.
| | |
|---|---|
| H01L 23/48 | (2006.01) |
| H01L 23/52 | (2006.01) |
| H01L 29/40 | (2006.01) |
| H01L 23/498 | (2006.01) |
| H01L 21/78 | (2006.01) |
| H01L 23/02 | (2006.01) |
| H01L 23/495 | (2006.01) |
| H01L 23/00 | (2006.01) |
| H01L 23/31 | (2006.01) |

(52) U.S. Cl.
CPC .......... *H01L 23/564* (2013.01); *H01L 23/3157* (2013.01); *H01L 23/48* (2013.01); *H01L 24/05* (2013.01); *H01L 23/3121* (2013.01); *H01L 2924/13091* (2013.01)

(58) Field of Classification Search
CPC ................. H01L 2224/48227; H01L 2224/94; H01L 24/05; H01L 21/78; H01L 2221/68386; H01L 2224/0347; H01L 2224/0391; H01L 2224/05558; H01L 2224/13018; H01L 23/564; H01L 23/48; H05K 2201/0195

USPC .................................................. 257/668–778
See application file for complete search history.

(56) References Cited

U.S. PATENT DOCUMENTS

| | | | | |
|---|---|---|---|---|
| 6,150,725 | A * | 11/2000 | Misawa et al. ................ | 257/781 |
| 6,329,722 | B1 * | 12/2001 | Shih et al. ..................... | 257/786 |
| 7,433,192 | B2 * | 10/2008 | Bambridge et al. .......... | 361/710 |
| 7,812,432 | B2 * | 10/2010 | Hou et al. ..................... | 257/676 |
| 2012/0091594 | A1 * | 4/2012 | Landesberger et al. ....... | 257/774 |
| 2013/0234307 | A1 * | 9/2013 | Nondhasittichai et al. ... | 257/676 |
| 2014/0048766 | A1 * | 2/2014 | Chu et al. ....................... | 257/13 |

OTHER PUBLICATIONS

Author Unknown. "Durimide® 7500 Photosensitive Polyimide Precursor." Technical Product Information. Fujifilm Electronic Materials, May 2012. pp. 1-2.

* cited by examiner

*Primary Examiner* — Howard Weiss
*Assistant Examiner* — Nelson Garces
(74) *Attorney, Agent, or Firm* — Murphy, Bilak & Homiller, PLLC

(57) ABSTRACT

A die according to an embodiment includes a contact pad configured to provide an electrical contact to a circuit element included in the die, a lateral edge closest to the contact pad and a cover layer including a protective structure, the protective structure including at least one elongated structure, wherein the cover layer includes an opening providing access to the contact pad to couple the contact pad electrically to an external contact, wherein the protective structure is arranged between the lateral edge and the contact pad. Using an embodiment may reduce a danger of contamination of a top side of a die during fabrication and packaging a chip.

19 Claims, 4 Drawing Sheets

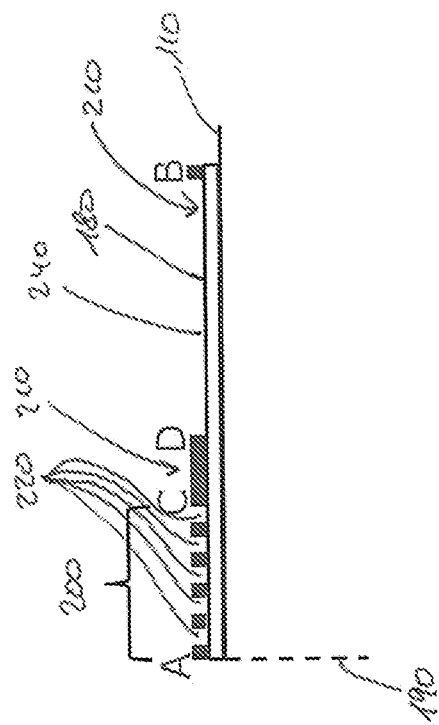
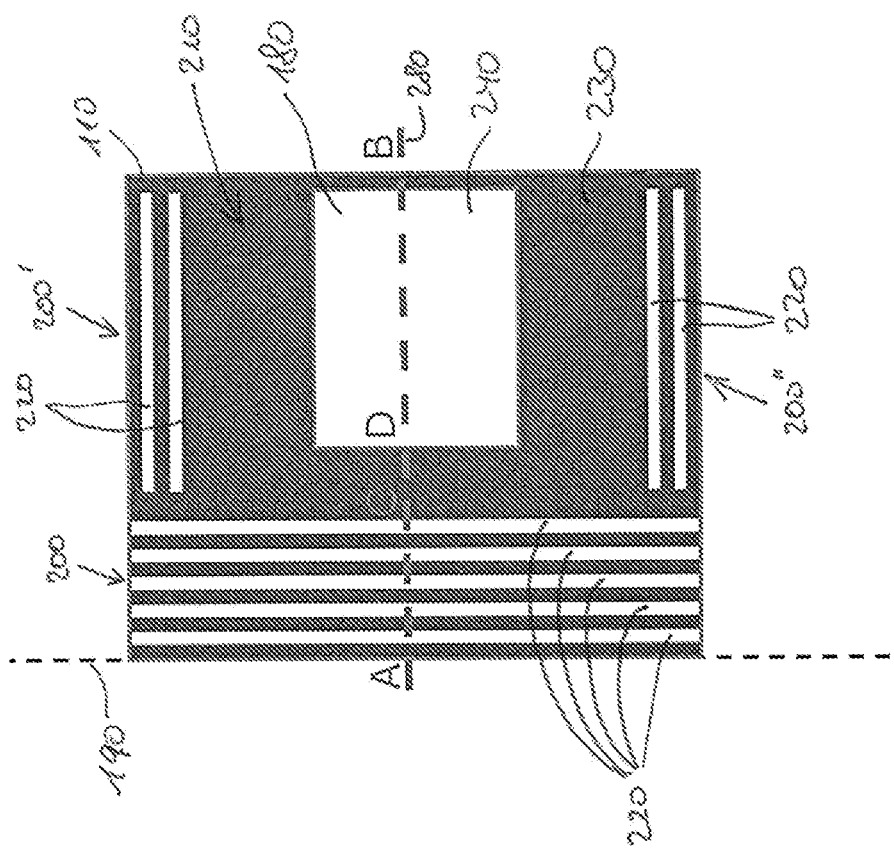

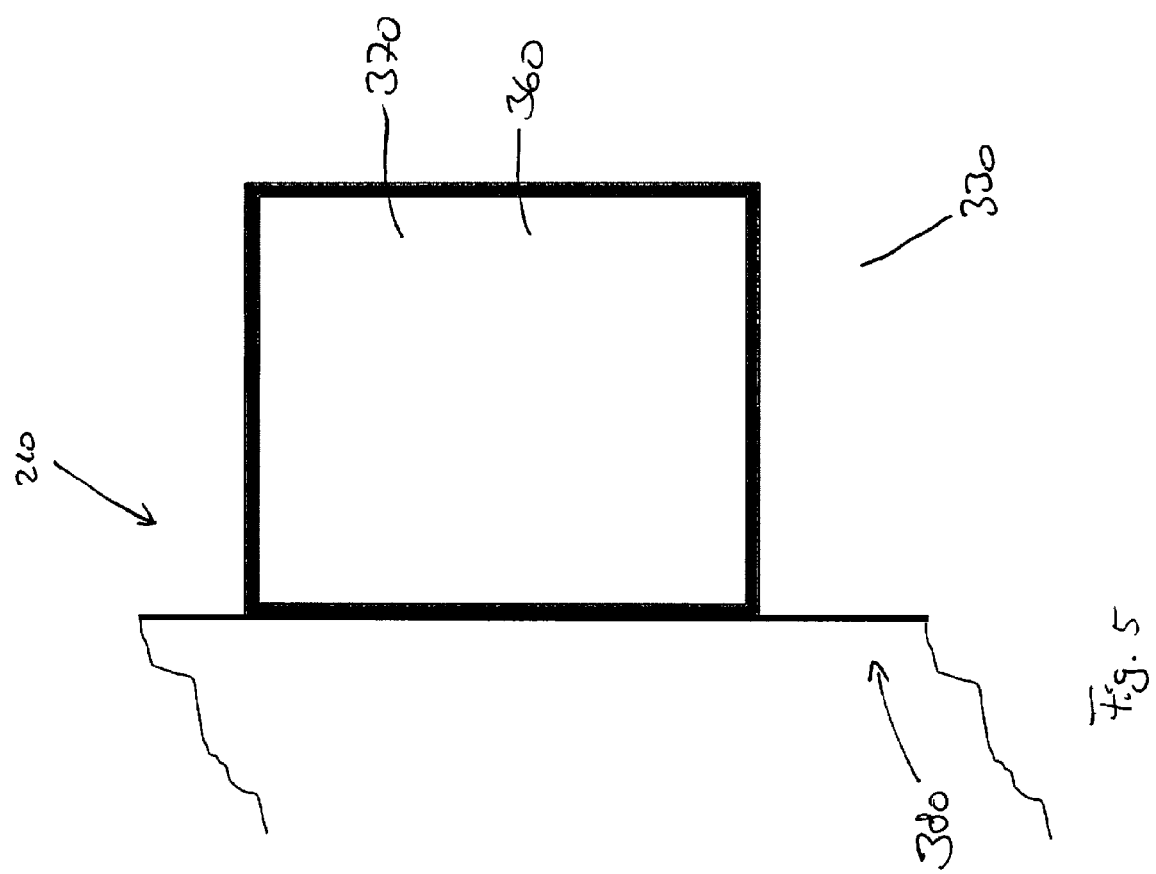

DIE AND CHIP

TECHNICAL FIELD

Embodiments relate to a die and a chip.

BACKGROUND

Electronic and electric devices including integrated circuits (IC), sensors and other more complex devices, but also discrete electronic devices are often today implemented based on thin film and semiconductor or semiconductor-related technologies. The respective structures are typically formed on or integrated into a substrate material such as a semiconductor material. The fabrication is typically performed on a wafer-scale, followed by a dicing of the wafer into individual dies. The dies are then typically packaged to form chips.

In the framework of packaging, the dies are often mounted onto a carrier such as a leadframe. Often, some form of adhesive including solder pastes are used to mount the die onto the carrier.

However, these adhesives often contain some form of flux or other component which tends to creep onto a top surface of the die. This may, however, lead to undesired results and problems during the further manufacturing, the performance of the device or other device-related properties.

Since a size of the die typically directly relates into an efficiency of the fabrication process, a tendency exists to reduce a size of the respective dies. As a consequence, contact pads used, for instance, to enable the respective electronic or electric device to communicate with external elements, tend to be integrated more closely to a lateral edge of the respective die. Therefore, a danger of an unwanted contamination of the contact pads tends to increase.

SUMMARY

Therefore, a demand exists to reduce a danger of contamination of a top side of a die during fabrication and packaging a chip.

A die according to an embodiment comprises a contact pad configured to provide an electrical contact to a circuit element comprised in the die, a lateral edge closest to the contact pad and a cover layer comprising a protective structure, the protective structure comprising at least one elongated structure. The protective structure is arranged between the lateral edge and the contact pad.

A die according to an embodiment comprises a contact pad configured to provide an electrical contact to a circuit element comprised in the die, a lateral edge closest to the contact pad and a protective structure comprising at least one elongated structure, wherein the protective structure is arranged between the lateral edge and the contact pad.

A chip according to an embodiment comprises a carrier and a die comprising a contact pad configured to provide an electrical contact to a circuit element comprised in the die, a lateral edge closest to the contact pad and a protective structure, the protective structure comprising at least one elongated structure, wherein the protective structure is arranged between the lateral edge and the contact pad. The die is mounted onto the carrier using a solder paste.

Those skilled in the art will recognize additional features and advantages upon reading the following detailed description, and upon viewing the accompanying drawings.

BRIEF DESCRIPTION OF THE DRAWINGS

Several embodiments of the present invention will be described in the enclosed Figures. In the Figures:

FIG. 2 shows a schematic plan view of a die according to a further embodiment;

FIG. 3 shows a cross-sectional view of the die of FIG. 2 along a dashed line shown in FIG. 2;

FIG. 5 shows a more conventional approach illustrating the danger of contamination.

DETAILED DESCRIPTION

Figure 1:
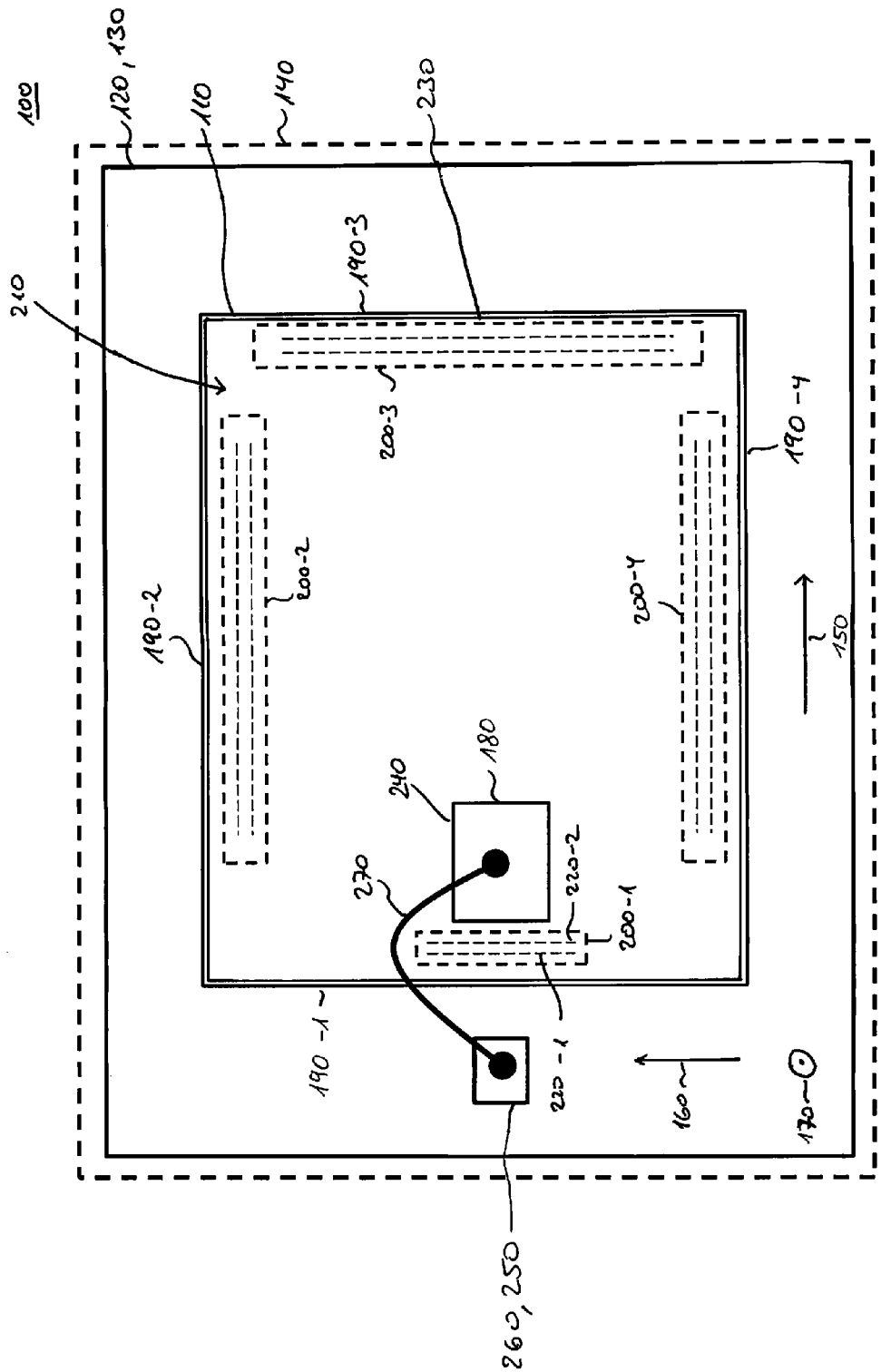
FIG. 1 shows a schematic plan view of a chip according to an embodiment comprising a die according to an embodiment.

In the following, embodiments according to the present invention will be described in more detail. In this context, summarizing reference signs will be used to describe several objects simultaneously or to describe common features, dimensions, characteristics, or the like of these objects. The summarizing reference signs are based on their individual reference signs. Moreover, objects appearing in several embodiments or several figures, but which are identical or at least similar in terms of at least some of their functions or structural features, will be denoted with the same or similar reference signs. To avoid unnecessary repetitions, parts of the description referring to such objects also relate to the corresponding objects of the different embodiments or the different figures, unless explicitly or—taking the context of the description and the figures into account—implicitly stated otherwise. Therefore, similar or related objects may be implemented with at least some identical or similar features, dimensions, and characteristics, but may be also implemented with differing properties.

In chips, which are sometimes also referred to as microchips, a die is often mounted onto a carrier such as a leadframe by using an adhesive such as solder paste. When using such an adhesive, a danger exists that the adhesive or a component thereof, for instance a flux, creeps from the back side of the die along the lateral edges onto the top side of the die. This may, however, lead to undesired effects concerning the further manufacturing process operations, packaging operations, or the further performance of the respective electric or electronic device implemented by the chip.

For instance, when a die is soldered onto a leadframe comprising a flux, which in turn comprises tin (Sn) or lead (Pb), the flux containing these atoms may creep from the back side of the die along the lateral edges of the die onto the front side or top side of the die. The flux can interact in this case with the front side metallization (FSM) of the die, which may lead to corrosion or a diffusion process of the tin (Sn) or lead (Pb) atoms into the metal of the front side metallization.

Diffusion of tin or lead atoms into the front side metallization may, however, lead to a mechanical destabilization of the metallization with respect to their mechanical properties. For instance, the adhesion of the metallization on a dielectric arranged underneath the metallization may be reduced to such a level that the metallization may come loose after alloying of the bond wire during the following tightening of the bond wire. The bond wire as well as the bond ball may separate and be torn off the dielectric leading to the so-called lifted metal effect.

However, not only when using solder paste but also other adhesives similar or other unwanted effects may occur when other adhesives or other bonding or mounting techniques are used to mount a die on a carrier such as a leadframe.

As will be outlined below, using an embodiment may reduce a corresponding risk of contamination of a top side of a die during manufacturing and packaging and, for instance, contamination of a contact pad arranged on the top side.

FIG. 1 shows a schematic plan view of a chip 100 comprising a die 110 according to an embodiment. Apart from the die 110, the chip 100 further comprises a carrier 120, which may, for instance, be implemented as a leadframe 130. Moreover, the chip 100 may comprise a mold compound 140 encapsulating the die 110 and the carrier 120 to form an encapsulated chip 100. Instead of using a molding technique to encapsulate the die 110 along with its carrier 120, naturally any other encapsulating technique may also be used.

The die 110 is typically a substrate having an essentially rectangular or quadratic form. Along a first direction 150 and along a second direction 160, the die comprises a length or extension being significantly larger than along a third direction 170, which is essentially perpendicular to both the first and second directions 150, 160. The first and second directions 150, 160 are typically also perpendicular with respect to one another. The extension with respect to the third direction 170 is also referred to as the thickness of the die 110. Often, the thickness of the die 110 is at least five times smaller than a length of the die 110 along the first and second directions 150, 160.

In principle, the die 110 may be any material suitable for integrating or providing the respective electrical circuit element or electrical or electronic circuit. For instance, the die 110 may comprise an electrically-insulating material, an electrically-conductive material or a combination thereof. For instance, the die 110 may comprise a semiconducting material such as silicon (Si), germanium arsenide (GeAs), silicon carbide (SiC) or the like. The die 110 may be diced from a wafer or a similar structure comprising the respective material of the die 110 after at least some of the fabrication processes have been carried out.

During the fabrication process typically a contact pad 180 is also provided, which enables establishing an electrical contact to the circuit element comprised in the die 110. Due to the tendency of a higher implementation density of circuit elements and, as a consequence, shrinking die sizes at least some contact pads are more closely arranged along a lateral edge 190-1 of the die 110 than in more conventional design approaches. In the example shown in FIG. 1, the lateral edge 190-1 is the lateral edge being closest to the contact pad 180. In other words, a distance from the contact pad 180 to any of the lateral edges 190 of the die 110 along a direction perpendicular to the respective lateral edges 190 is smallest with respect to the lateral edge 190-1.

Apart from the lateral edge 190-1, the die 110 further comprises lateral edges 190-2, 190-3 and 190-4. The lateral edges 190-1 and 190-3 are arranged in parallel and are essentially oriented perpendicular to the first direction 150 and, hence, parallel to the second direction 160. The lateral edges 190-2, 190-4 are in contrast arranged essentially perpendicular to the second direction 160 and, hence, parallel to the first direction 150. Also these two lateral edges are essentially arranged in parallel.

The die 110 further comprises a protective structure 200-1, which may, for instance, be configured and arranged such that via the protective structure 200-1 any electrical contact to any circuit or any circuit element comprised in the die by a bond wire may be prevented without destroying or damaging the protective structure 200-1. For instance, the protective structure 200-1 may be implemented such that the described electrical contact through the protective structure is prevented. The protective structure 200-1 is arranged between the closest lateral edge 190-1 and the contact pad 180.

The term "comprised" in this context may cover all possible implementations of a circuit or a circuit element being integrated into the die 110, provided on the die 110, for instance on a surface of the die 110, or any combination thereof.

As will be laid out in more detail below, the protective structure 200-1 may be configured to cause a modulation of a profile of a top surface 210 of a die 110 along the first direction 150 perpendicular to the (closest) lateral edge 190-1 of the contact pad 180. The profile itself is in this case taken along the third direction 170. To put it in more general terms, the protective structure 200-1 causes a modulation of the profile of the top surface 210 of the die 110 along a direction perpendicular to the lateral edge 190 in question. For instance, the profile may change from a first level above a reference plane perpendicular to the third direction 170 to a second level parallel to the first level but different from the first level and returns back to the first level. In other words, the profile comprises the first level, the second level being different from the first level and the first level again.

The protective structure 200-1 comprises at least one elongated structure 220, which may comprises an extension parallel to the lateral edge 190-1 in question, longer than an extension towards the contact pad 180. In the example shown in FIG. 1, the protective structure 200-1 comprises two elongated structures 220-1, 220-2. Naturally, in other embodiments, the number of elongated structures 220 may differ. For instance, the protective structure 200 may comprise just a single elongated structure 220 or even more than just two elongated structures 220. However, in other embodiments, the protective structure 200 may not even be required to comprise any elongated structure at all. To put it in other words, the protective structure 220 may extend parallel to the lateral edge 190-1 at least alongside the contact pad 180 such that at least one of the at least one elongated structure 220 of the protective structure 200-1 is arranged in the direction 150 perpendicular to the lateral edge 190-1 between the lateral edge 190-1 and the contact pad 180.

Very often, the extension of the elongated structures 220 along the respective lateral edge 190-1 (second direction 160) is significantly larger than a width of the elongated structure 220 in the direction perpendicular to the respective lateral edge 190-1 (first direction 150). For instance, the length of the elongated structure 220 along the direction of the respective lateral edge 190 may be at least five times, at least ten times, at least twenty times, at least fifty times or at least one hundred times larger than the corresponding width of the elongated structure 220 perpendicular to the respective lateral edge 190-1. In other words, the at least one elongated structure 220 may comprise a first extension parallel to lateral edge 190-1 (along the second direction 160) and a second extension in the direction perpendicular to the lateral edge 190-1 from the lateral edge 190-1 to the contact pad 180 (along the first direction 150) such that a ratio of the first extension with respect to the second extension is at least one of being larger than 5, larger than or equal to 10, larger or equal to 20, larger or equal to 50 and larger or equal to 100.

The protective structure 200-1 may be configured to reduce a risk of a solder paste or another adhesive to creep over the (closest) lateral edge 190-1 to contaminate the contact pad 180. To achieve this, the protective structure 200 may not only be designed and configured to cause the previously-described modulation of the profile of the top surface 210 of the die 100 along the direction perpendicular to the lateral edge (first direction 150), it may also be advisable to implement the protective structure such that the protective structure or its at least one elongated structure 220 extends further along the contact pad 180 along the second direction 160 in the case of the lateral edge 190-1, than a length of the contact pad 180 parallel to the closest lateral edge 190-1 in the case depicted in FIG. 1. To further reduce the risk of the solder paste or another adhesive to creep over the lateral edge 190-1 to contaminate the contact pad 180, it may be further advisable to implement the protective structure 200-1 to comprise more than just one elongated structure 220 as shown in FIG. 1. The protective structures 200 may—as shown in FIG. 1—comprise a plurality of parallel arranged elongated structures 220.

The protective structure 200 may, for instance, be implemented based on a cover layer 230. The cover layer 230 may be provided on an upper surface of the die 110 in such a way that the cover layer 230 forms the top surface 210 of the die 110. The cover layer 230 may comprise an opening 240 providing access to the contact pad 180 to couple the contact pad 180 electrically to an external component 250, such as a contact to name just one example. As shown in FIG. 1, the external component 250 may, for instance, be a bond pad 260 for a bond wire 270 or another contact area of the carrier 120 of the leadframe 130.

Depending on the concrete material used for the cover layer 230, the cover layer 230 may, for instance, electrically insulate a surface of the die 110 below the cover layer 230 from unwanted shortcuts and electrical contacts. Additionally or alternatively, the cover layer 230 may also serve a stress relief layer.

Depending on the application in mind and the boundary conditions, the cover layer 230 may be formed of an organic material, an inorganic material or a combination of both. For instance, the cover layer 230 may comprise a polyamide, a polyimide, a fully-imidized polyimide, a fully-imidized polyimide-amide, a polyamic acid formulation, a polyimide acid formulation, a polybenzoxazole, silicon dioxide ($SiO_2$), silicon nitride ($Si_3N_4$), germanium oxide ($Ge_xO_y$) or germanium nitride ($Ge_xN_y$). Naturally, also a combination of any of the previously-mentioned materials or other organic or inorganic materials may also be used to form the cover layer 230. For instance, the cover layer 230 may comprise more than one layer.

In terms of an easy implementation of the protective structure 200 into the fabrication or processing operation, it may be interesting to fabricate the cover layer 230 based on a photosensitive precursor or based on a self-priming non-photosensitive formulation. In the first case, the photosensitive precursor may, for instance, be implemented as a positive-acting or a negative-acting photoresist, which can be photo-lithographically patterned using, for instance, a stepper.

In this case, after spinning on the photosensitive precursor, optionally a soft-bake process may follow before the exposure with ultraviolet radiation using, for instance, a stepper. Afterwards, a development process may follow including optionally rinsing the substrate and drying it. Eventually, a curing process may follow.

Depending on the materials used, thicknesses of less than 1 µm up to several 10 µm and even up to more than 100 µm may be obtainable based on such a photosensitive precursor process forming, for instance, a cover layer 230 comprising a polyimide.

In the case that the protective structure 200 is implemented in the cover layer 230, the protective structure 200 may comprise at least one trench-like structure as the elongated structure 220. By implementing a trench-like structure, not only the profile of the top surface 210 of the die 110 is modulated in the described way, the trench-like structures may also serve to transport the adhesive or the solder paste creeping over the lateral edge 190 onto the top surface 210 of the die 110 may be more evenly distributed or even transported away from the contact pad. However, the trench-like structures may serve as a basin to gather the flux or adhesive.

Depending on the implementation, it may be advisable to implement the trench-like structures having an aspect ratio of at least 1. In other embodiments, the aspect ratio may be at least 2, at least 3 or more. The aspect ratio may be a ratio of the height along the direction perpendicular to the top surface 210 and its width.

Naturally, as also shown optionally in FIG. 1, the die 110 may comprise a plurality of protective structures 200-1, 200-2, 200-3 and 200-4 arranged along the plurality of lateral edges 190-1, 190-2, 190-3, 190-4, respectively, to prevent the adhesive or the solder paste from creeping via any of the lateral edges 190-1, 190-2, 190-3, 190-4 onto the top surface 210 of the die 110 to reach the contact pad 180 or other contact pads arranged on the die 110. Each of the protective structures 200 may comprise elongated structures 220 as described before.

For instance, implementing a protective structure 200 according to an embodiment may be advisable in the case when the contact pad 180 comprises a metallic material, for instance, aluminum-silicon-copper (AlSiCu). In the case that a solder paste is used, in such a case atoms comprised in the solder paste may damage the metallic material as described before leading to a destabilizing of the metallization in terms of its mechanical and/or electrical properties. However, also in the case of other adhesives or materials used for mounting the die 110 onto the carrier 120, using protective structures 200 in a die 110 or a chip 100 according to an embodiment may be advisable to improve, for instance a yield of the fabrication and packaging process or to prevent or to reduce a degradation of a performance of the devices. In other words, by applying a die 110 or a chip 100 according to an embodiment, the protective structure 200 may prevent or at least reduce a risk that a flux of a solder paste may reach an area of the front side metallization on the top surface 210 (contact pad 180) to prevent the previously-described lifted metal effect.

FIG. 2 shows a simplified plan diagram of a die 110 comprising a contact pad 180 and a cover layer 230 which comprises an opening 240 to allow access to the contact pad 180. However, along a lateral edge 190 indicated in FIG. 2 by a dashed line, a protective structure 200 comprising a plurality of trench-like elongated structures 220 is implemented. To be a little more specific, the elongated structures 220 form a protective grating in the cover layer 230 acting as a passivation layer. Apart from the protective structure 200, the die 110 as shown in FIG. 2 further comprises above and below the contact pad 180 further protective structures 200' and 200" each comprising at least two trench-like elongated structures 220, which are implemented as trenches in the cover layer 230 as well.

FIG. 3 shows a cross-sectional view of the die 110 along a dashed line 280 in FIG. 2. FIG. 3 illustrates that not only the opening 240 but also the trench-like elongated structures 220 of the protective structure 200 are formed as openings in the cover layer 230. As will be laid out in more detail below, integrating these trenches or gratings into an existing process to implement such a protective grating in the passivation may be achievable by a comparably small layout modification of the passivation process.

The embodiment shown in FIGS. 2 and 3 of a multiple trench-protective structure 200 to prevent corrosion of bond pads such as the contact pad 180 uses the fact that the passivation layer or cover layer 230 is brought onto the front side metallization forming at least partially the contact pad 180.

The passivation layer may be formed by a single layer or may comprise more layers or films which can be lithographically patterned in such a way that at specific locations by means of an etching process, a development process or another material removing process, the material of the cover layer 230 may be removed.

Conventionally, this is used to create openings 240 in the passivation layer providing access to the front side metallization, at which, for instance, for testing purposes prior to the packaging or mounting process into the housing of the chip the die may be electrically contacted. The openings 240 may additionally or alternatively be used during the packaging process to contact the die 110 mechanically and electrically with the housing for instance comprising the carrier 120 (not shown in FIGS. 2 and 3).

Embodiments comprise adding special layout structures (protective structures 200) which may be processed during the existing patterning process for the passivation layer. Along with the regular openings 240 of the passivation layers, which are intended, for instance, for providing the bond wires 270 to the respective contact pads 180, the protective structures 200 may be implemented upstream with respect to the lateral edge 190 of the die 110.

As described in the context of FIGS. 1 to 3, the protective structures 200 may comprise several trench-like openings (elongated structures 220) in the cover layer 230 acting, for instance, as a passivation layer. This may offer the possibility of only slightly amending an implementation of an established passivation layout. It may be possible that neither significant process changes nor additional technology-involved process operations are to be implemented, which may lead to an increase of the variable costs for manufacturing and packaging a chip 100 or a die 110. The fixed costs for implementing an embodiment which may comprise, for instance, costs for new lithography masks as well as a possible modification of a prober in terms of the arrangement of the individual probing contacts may be easily and very cost-efficiently implemented for many products. For newly-developed products, implementing a die 110 or a chip 100 according to an embodiment may even be completely neutral in terms of costs and effort.

As the previous description has shown, the protective structures 200 used in embodiments of a die 110 and a chip 100 are based on changing the topology of the top surface 210 of the die 110. By implementing the protective structures 200 and, hence, by modifying the profile of the top surface 210 of the die 110, an effective step height of the cover layer 230 acting, for instance, as a passivation layer, may be increased such that the flux of the solder paste or another adhesive needs to surmount these additional structures to reach the top surface 210 or the front side of the die 110. This effect may be increased by implementing the protective structure 200 as a multiple trench structure. Moreover, the trenches may act as a catch basin or a guide for the flux or the adhesive. As a consequence, a further flowing or creeping of the respective material onto the top surface 210 away from the respective lateral edge 190 may be made more difficult or—given a sufficient number of elongated structures 220 or trenches—completely prevented. Depending on boundary conditions used, for instance, for mounting the die 110 onto the carrier 120, the change of the passivation layout as shown in FIGS. 2 and 3 may be sufficient.

The protective structures 200 may become visible by removing the housing of the chip 100 at least partially to obtain access to the top surface 210 of the die 110 to enable a visual check of the cover layer 230 in some examples.

Hence, FIGS. 2 and 3 show a top view and a lateral view of a depth profile along an intersection along a line 280 in FIG. 2 from A to B showing the metallization of the contact pads which are also referred to as wire bonding areas, with their passivation fully opened. The protective gratings (elongated structures 220 of the protective structures 200) are etched or developed into the passivation layer (cover layer 230). Naturally, other areas of the die 110 may still be covered by the cover layer 230 (passivation layer or passivation layers). As outlined, it may be possible with a modified polyimide layout including protective gratings to improve a yield by preventing or at least reducing the risk of solder paste and other adhesives from getting onto the contact pads 180.

Figure 4:
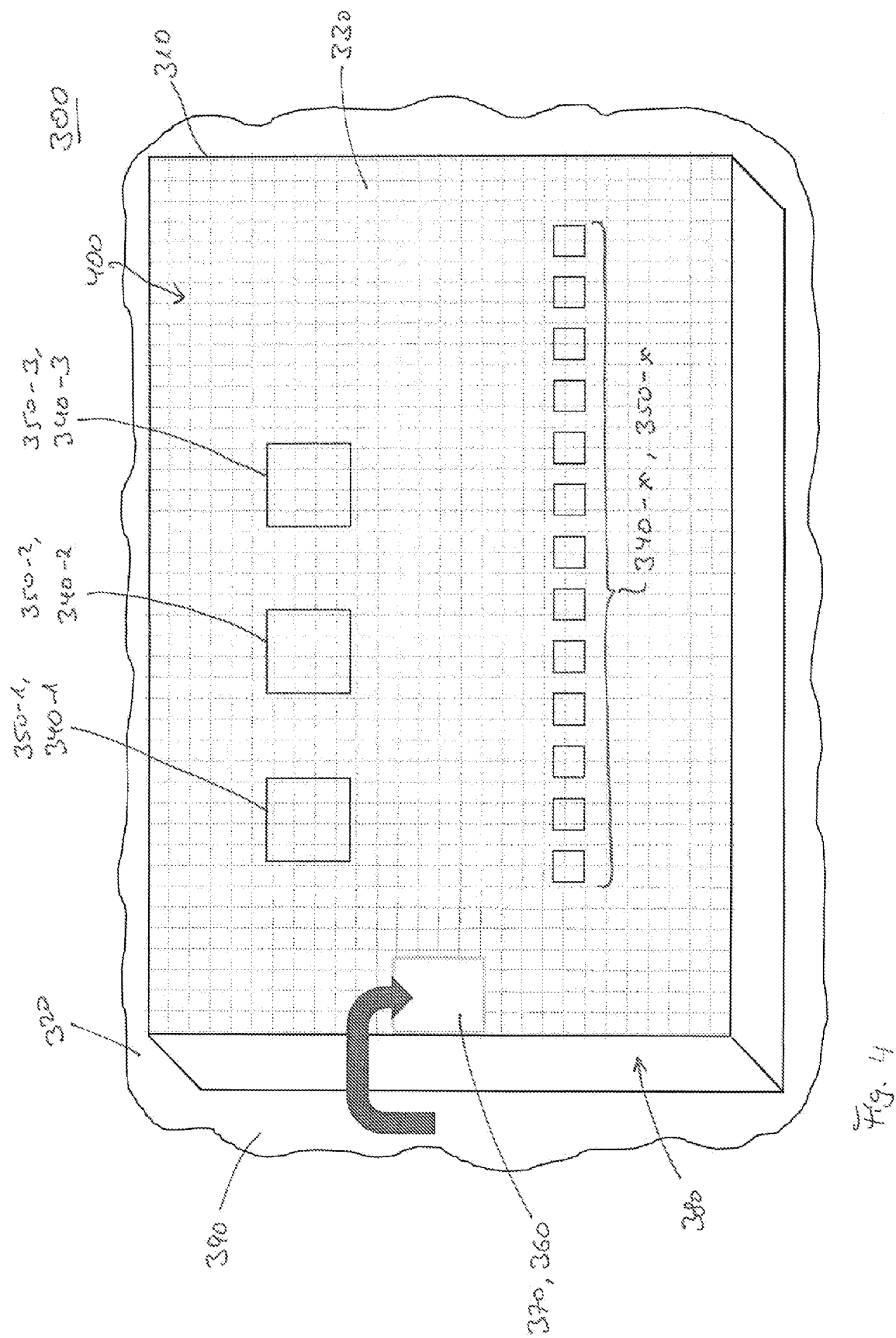
FIG. 4 shows a schematic view of a more conventional die comprising several contact pads.

FIG. 4 shows a more conventional example of a passivation layout for a complete chip such as a power MOSFET (Metal Oxide Semiconductor Field Effect Transistor). FIG. 4 shows a perspective view of a chip 300 comprising a die 310 on a leadframe 320. The die 310 is covered by a passivation layer 330, which covers the complete die surface except for several contact pads 340 which are covered by a source metallization and a passivation, wherever the passivation is not intentionally opened or removed. For instance, in an upper part of FIG. 4, the die 310 shows three contact pads 340-1, 340-2, 340-3 along with three passivation openings 350-1, 350-2, 350-3, respectively, which may be used as probe pads for the source metallization. Moreover, the die 310 further comprises several further passivation openings 350-X and corresponding contact pads 340-X, which may be used, for instance, to probe further structures of the die 310 or which may be used as contact pads during the packaging process.

The passivation openings 350 are located comparably far away from the lateral edges of the die 310 such that a chance of being contaminated by a flux of a solder paste is comparably low since the creep distance for the flux is comparably large. However, this may not always be possible since it may lead to structural problems such as a higher chip area demand, a limitation in terms of assembly design rules including required distances for bond wires and other less favorable consequences. In other words, implementing a sufficiently-high creep distance may require comparably large dies and chips, which offer the corresponding degrees of freedom to arrange and locate the corresponding contact pads 340.

This, however, may not always be possible. To illustrate this, FIG. 4 shows a further contact pad 360 along with a further passivation opening 370 which is located close to a lateral edge 380 of the die 310. The further passivation opening 370, which is also referred to as an imide opening in the case of the corresponding passivation layer 330 being implemented as polyimide layer, is typically implemented to practically cover the full corresponding further contact pad 360 which may, for instance, be a gate pad. As a consequence, the flux of a solder paste 390 comprising diffusive atoms or contamination atoms, such as tin (Sn) and/or lead (Pb) atoms, may creep onto the top surface 400 of the die 310 via the lateral chip edge 380 as indicated by the thick arrow in FIG. 4.

Turning to FIG. 5, FIG. 5 shows an enlarged view of the area of the further contact pad 360 (wire bonding area) along with the further passivation opening 370. Due to the flux of the solder paste 390 (not shown in FIG. 5) the area of the further contact pad 360 may be contaminated by diffusive atoms or contamination atoms causing a corrosion-like destabilization of the front side metallization of the further contact pad 360.

Conventionally, it may also be possible to use a metal which is less susceptible to contaminations such as tin or lead. For instance, instead of using such a material system, such as aluminum-silicon-copper (AlSiCu), alternative, less sensitive material systems, such as aluminum-copper (AlCu), may be used as front side metallization material. However, this may significantly complicate the fabrication process when, for instance, a multiple layer arrangement for the metallization is to be implemented. This may lead to a more complex process and, hence, to both, a lower yield and higher chip fabrication costs.

Embodiments may, for instance, be used for discrete devices. A discrete device may form a single unit which can easily be handled and integrated into a more complex electronic circuit or mounted onto a printed circuit board or another carrier. Typically, dimensions of the discrete device according to an embodiment are at most 50 mm, at most 30 mm or at most 20 mm, for instance 4 mm. Naturally, a discrete device may comprise more than one substrate or die 110. In other words, it may be implemented as a multichip module comprising two or more dies 110 housed in the same package. The two or more substrates may be arranged parallel or orthogonally with respect to one another. For instance, one or more dies may be arranged in a vertical position while another die may be arranged horizontally. Depending on the concrete implementation, the different dies 110 may comprise circuits for different purposes.

In other words, a discrete device may be contained in terms of its circuitry or formed on a single substrate or die 110. However, it may also be distributed over several substrates or dies 110 with the substrates being arranged or contained in a single package. For instance, all parts of the device may be manufactured in a single process sequence, such as a semiconductor wafer processed to fabricate the respective devices. Sometimes, parts of the device may be manufactured after a typical microelectronic wafer manufacturing process. For instance, additional structures may be used and arranged in the framework of such a discrete device.

In order to prelude the wafer fabrication, these components may be implemented immediately after the more standard wafer processes and yet these processing operations may still be closely linked to the actual wafer fabrication, particularly, if a final passivation layer protecting circuit and sensor elements is applied afterwards.

Naturally, a possible implementation may be that the device may undergo electrical or other testing procedures, before it is assembled in a more complex system. These test procedures may comprise a simplified test allowing verifying if the device works and if the performance is in the expected limits. In other words, the test may be used to see if an additional calibration may be unnecessary, advisable or perhaps even necessary. However, it may be interesting to try to avoid an additional calibration to avoid implementing additional memory or other systems. This may, for instance, be avoided by using a set of similar structures having similar properties and/or characteristics within a specified and application-specific margin. For instance, the respective structures may be formed or fabricated during the same process steps. In other words, a discrete device such as a chip 100 according to an embodiment may be implemented comprising one or more dies 110.

Using an embodiment may reduce a danger of contamination of a top side of a die during fabrication and packaging a chip. In other words, an embodiment may reduce a risk of a contamination of a contact pad 180 of a by implementing a protective structure 200 between the lateral edge 190 closest to the contact pad 180 and the contact pad 180.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The methods described herein may be implemented as software, for instance, as a computer program. The sub-processes may be performed by such a program by, for instance, writing into a memory location. Similarly, reading or receiving data may be performed by reading from the same or another memory location. A memory location may be a register or another memory of an appropriate hardware. The functions of the various elements shown in the Figures, including any functional blocks labeled as "means", "means for forming", "means for determining" etc., may be provided through the use of dedicated hardware, such as "a former", "a determiner", etc. as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the Figures are conceptual only. Their function may be carried out through the operation of program logic, through dedicated logic, through the interaction of program control and dedicated logic, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes, which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple substeps. Such substeps may be included and part of the disclosure of this single step unless explicitly excluded.

What is claimed is:

1. A die comprising:
    a contact pad configured to provide an electrical contact to a circuit element comprised in the die;
    a lateral edge closest to the contact pad; and
    a cover layer comprising a protective structure, the protective structure comprising at least one elongated structure,
    wherein the protective structure is arranged between the lateral edge and the contact pad,
    wherein the protective structure is configured to cause a modulation of a profile of a top surface of the die along a direction perpendicular to the lateral edge.

2. The die according to claim 1, wherein the protective structure extends parallel to the lateral edge at least alongside the contact pad such that at least one of the at least one elongated structures of the protective structure is arranged in a direction perpendicular to the lateral edge between the lateral edge and the contact pad.

3. The die according to claim 1, wherein the at least one elongated structure comprises a first extension parallel to lateral edge and a second extension in a direction perpendicular to the lateral edge from the lateral edge to the contact pad such that a ratio of the first extension with respect to the second extension is at least one of being larger than 1, larger than or equal to 2, larger or equal to 5 and larger or equal to 10.

4. The die according to claim 1, wherein the protective structure comprises a plurality of parallel arranged elongated structures.

5. The die according to claim 1, wherein the protective structure comprises at least one trench-like structure extending essentially parallel to the lateral edge.

6. The die according to claim 1, wherein the contact pad comprises a metallic material.

7. The die according to claim 1, wherein the protective structure is configured and arranged such that via the protective structure an electrical contact by a bond wire to any circuit or any circuit element comprised in the die is prevented.

8. A die comprising:
    a contact pad configured to provide an electrical contact to a circuit element comprised in the die;
    a lateral edge closest to the contact pad; and
    a protective structure comprising at least one elongated structure,
    wherein the protective structure is arranged between the lateral edge and the contact pad,
    wherein the protective structure is configured to cause a modulation of a profile of a top surface of the die along a direction perpendicular to the lateral edge.

9. The die according to claim 8, wherein the protective structure extends parallel to the lateral edge at least alongside the contact pad such that at least one of the at least one elongated structures of the protective structure is arranged in a direction perpendicular to the lateral edge between the lateral edge and the contact pad.

10. The die according to claim 8, wherein the at least one elongated structure comprises a first extension parallel to lateral edge and a second extension in a direction perpendicular to the lateral edge from the lateral edge to the contact pad such that a ratio of the first extension with respect to the second extension is at least one of being larger than 1, larger than or equal to 2, larger or equal to 5 and larger or equal to 10.

11. The die according to claim 8, wherein the protective structure comprises a plurality of parallel arranged elongated structures.

12. The die according to claim 8, further comprising a cover layer, the cover layer comprising the protective structure, and wherein the cover layer comprises an opening providing access to the contact pad to couple the contact pad electrically to an external component.

13. The die according to claim 12, wherein the cover layer is configured to at least one of electrically insulating a surface of the die and providing a stress relief.

14. The die according to claim 12, wherein the cover layer comprises at least one of an organic material and an inorganic material.

15. The die according to claim 12, wherein the cover layer comprises at least one of a polyamide, a polyimide, a fully imidized polyimide, a fully imidized polyimide-amide, a polyamic acid formulation, a polyimide acid formulation, a polybenzoxazole, silicon oxide, silicon nitride, germanium oxide and germanium nitride.

16. The die according to claim 15, wherein the cover layer is fabricated from a photosensitive precursor or from a self-priming non-photosensitive formulation.

17. The die according to claim 12, wherein the protective structure comprises at least one trench-like structure extending essentially parallel to the lateral edge.

18. The die according to claim 8, comprising a plurality of lateral edges and along each of the plurality of lateral edges at least one protective structure.

19. A chip comprising:
    a carrier; and
    a die comprising a contact pad configured to provide an electrical contact to a circuit element comprised in the die, a lateral edge closest to the contact pad, and a protective structure, the protective structure comprising at least one elongated structure,
    wherein the protective structure is arranged between the lateral edge and the contact pad;
    wherein the protective structure is configured to cause a modulation of a profile of a top surface of the die along a direction perpendicular to the lateral edge; and
    wherein the die is mounted onto the carrier using a solder paste.

* * * * *